United States Patent [19]

Wada et al.

[11] Patent Number: 4,758,942

[45] Date of Patent: Jul. 19, 1988

[54] TURN-OFF CONTROL CIRCUIT FOR A GATE TURN-OFF THYRISTOR

[75] Inventors: Masayuki Wada, Katsuta; Chooji Shiina, Hitachi; Tadaki Kariya, Ibaraki; Tatsuo Shimura, Hitachi, all of Japan

[73] Assignees: Hitachi Ltd.; Hitachi Haramachi Semi-Conductor. ltd., both of Tokyo, Japan

[21] Appl. No.: 105,810

[22] Filed: Oct. 8, 1987

[30] Foreign Application Priority Data

Oct. 8, 1986 [JP] Japan .................................. 61-237979

[51] Int. Cl.$^4$ ............................................. H02M 1/08
[52] U.S. Cl. ..................... 363/135; 307/633; 307/641
[58] Field of Search ............ 363/68, 135; 307/633, 307/641, 637

[56] References Cited

U.S. PATENT DOCUMENTS

| | | | |
|---|---|---|---|
| 4,117,351 | 9/1978 | Kalfus et al. | 307/633 |
| 4,231,083 | 10/1980 | Matsuda et al. | 307/633 |

FOREIGN PATENT DOCUMENTS

| | | | |
|---|---|---|---|
| 14355 | 1/1984 | Japan | 307/633 |
| 13422 | 1/1984 | Japan | 307/633 |

*Primary Examiner*—William H. Beha, Jr.
*Attorney, Agent, or Firm*—Antonelli, Terry & Wands

[57] ABSTRACT

A turn-off control circuit for a gate turn-off thyristor is used in a state where one end of an inductive load is connected therewith on the cathode side. The turn-off control circuit includes a first turning-off transistor, which takes-out electric current through the gate at the first stage of the turn-off operation of the gate turn-off thyristor, and a second turning-off transistor, which takes-out electric current through the gate at the second stage of the turn-off operation of the gate turn-off thyristor so as to surely effect the turn-off operation.

7 Claims, 5 Drawing Sheets

TURN-OFF CONTROL CIRCUIT FOR A GATE TURN-OFF THYRISTOR

BACKGROUND OF THE INVENTION

This invention relates to a turn-off control cirucit for a gate turn-off thyristor (hereinbelow abbreviated to GTO) and in particular to a turn-off control circuit of a GTO, with which an inductive load is connected on the cathode side.

A GTO is a thyristor, which is turned-off by making electric current flow-in through its P gate (which is in contact with its P base layer) or by making electric current flow-out through its N gate (which is in contact with its N base layer) similarly to a usual thyristor, but can be turned-off also by making electric current flow-out through the P gate, differently from a usual thyristor. A turn-on control circuit of a GTO is constructed similarly to a usual thyristor and a turn-off control circuit thereof is so constructed that a transistor is connected between the P gate and the cathode of the GTO, as described in JP-A-59-14355.

In this type of the turn-off control circuit there are two connection positions of the transistor, depending on the selection between the GTO and the load, as indicated in FIG. 1a and FIG. 1b. A turn-on control circuit is omitted in these circuits.

In FIG. 1a, a load 3 is connected between the positive electrode of a power source 70 for load and an anode 11 disposed on a P emitter layer $P_E$ of GTO 1 and a cathode 12 disposed on an N emitter layer $N_E$ of the GTO 1 and the negative electrode of the power source 70 for load are connected with a ground potential line 10. Further, the collector and the emitter of the turning off transistor $Q_{30}$ are connected between the P gate 13 disposed on the P base layer $P_E$ of the GTO 1 and the ground potential line 10, in parallel with a gate resistor 5, and a turning-off power source 8 is connected between the base of the turning-off transistor $Q_{30}$ and the ground potential line 10.

The passage of the GTO 1 from its on state to its off state is performed by turning-on the turning-off transistor $Q_{30}$ disposed between the P gate 13 disposed on the P base layer $P_B$ and the cathode 12 by means of a pulse from the turning-off power source 8. If the collector-emitter voltage $V_{CE}$ in the on state of the turning-off transistor $Q_{30}$ satisfies $$V_{CE} < V_{GK} \approx 0.6 \text{ [V]} \tag{1}$$

with respect to the potential between the P gate 13 and the cathode 12 in the on state of the GTO 1, it is possible to make electric current flow-out through the P gate 13. For this reason it is necessary that the turning-off transistor $Q_{30}$ operates at its saturation. On the other hand, electric current through the anode 11, when the GTO 1 is in the on state, being $I_A$, the maximum gate current $I_G$ flowing-out through the P gate 13 being $I_G$, the following relation is valid;

$$\text{turn-off gain} = I_A/I_G \approx 3 \text{ to } 5 \tag{2}$$

The value of the formula (2) varies, depending on the construction of the GTO and process parameters. Since the gate current $I_G$ determined by the formula (2) is the collector current $I_C$ of the turning-off transistor $Q_{30}$ and the turning-off transistor $Q_{30}$ operates at its saturation, the collector-emitter saturation voltage $V_{CES}$ of the turning-off transistor $Q_{30}$, when the gate current $I_G$ given by the formula (2) flows therethrough, should satisfy the following relation $$V_{CES} < 0.6 \text{ [V]} \tag{1a}$$

In the case where the turning-off transistor $Q_{30}$ is fed with a sufficient base current, the collector-emitter saturation voltage $V_{CES}$ of the turning-off transistor $Q_{30}$ is determined almost wholly by the collector resistance $R_C$. Since the collector resistance $R_C$ is inversely proportional to the geometrical dimension of the transistor, in the case where the GTO 1 and its turning-on or turning-off driving circuit are integrated on a silicon substrate (chip), enlargement of the turning-off transistor $Q_{30}$ causes increase in size of the chip.

For this reason, as disclosed in JP-A-59-14355, the cathode potential $V_K$ may be raised by inserting a diode or a resistor between the cathode 12 and the ground potential. In this case, since the collector-emitter saturation voltage $V_{CES}$ of the turning off transistor $Q_{30}$ is given by;

$$V_{CES} < V_{GK} + V_K \approx 0.6 + V_K \tag{3}$$

the turning-off transistor $Q_{30}$ can be made smaller, corresponding to the rise of $V_K$, by disposing the diode or the resistor.

In the circuit indicated in FIG. 1b, the load 3 is inserted between the cathode 22 of the GTO 2 and the ground potential line 10 and the gate resistor 5' is connected between the P gate 23 and the cathode 22. When the GTO 2 is in the off state, the cathode potential $V_K$ is nearly equal to the ground potential and when the GTO 2 is in the on state, the cathode potential $V_K$ is nearly equal to the voltage $V_{CC}$ of the power source 70 for load. When the GTO 2 is switched-over from the on state to the off state, the turning-off transistor $Q_{40}$ is turned-on. At this time, the emitter-collector voltage $V_{EC}$ of the turning-off transistor $Q_{40}$ varies approximately from the voltage $V_{CC}$ of the power source 70 for load to the saturation voltage $V_{CES}$ and the operation of this turning-off transistor $Q_{40}$ varies from the active state to the saturation state.

In this example, too, owing to the fact that the turn-off gain given by Formula (2) remains same, when the GTO 2 begins to vary from the on state to the off state, since the turning-off transistor $Q_{40}$ is in the active state, it is possible to take-out a sufficient gate current $I_G$. However, as the GTO 2 approaches the off state, since the collector potential of the turning-off transistor $Q_{40}$ approaches zero, the operation to take-out the gate current becomes same as that indicated in FIG. 1a. That is, the base bias current of the turning-off transistor $Q_{40}$ being $I_B$, the grounded emitter current amplification factor being $h_{EF}$, the following inequality should be valid;

$$I_G < h_{EF} I_E \tag{5}$$

However, unless the load 3 is a constant current load, the anode current $I_A$ also decreases as the result of decrease of the potantial of the cathode 22 as the GTO 2 passes to the off state. Thus, it is not necessary that the collector internal resistance $R_C$ of the turning-off transistor $Q_{40}$ is as high as that required in the case indicated in FIG. 1a and the geometrical size of the turning-off transistor $Q_{40}$ can be made smaller correspondingly.

However, in the case where the load is an inductor, which is a winding of a motor, as indicated in FIG. 2, the GTOs 1 and 2 are connected with the winding L of the motor on both sides thereof. The winding L is connected with the anode 11 of the GTO 1 and a current detection resistor 7 is connected between the cathode 12 and the ground potential line 10. The collector and the emitter of the turning-off transistor $Q_{30}$ are connected between the P gate 13 and the ground potential line 10 in parallel with a gate resistor 51 and a turning power source 81 is connected between the base and the ground potential line 10. On the other hand, the winding L is connected with the cathode 22 of the GTO 2 and a gate resistor 52 is connected between the P gate 23 and the cathode 22. The collector and the emitter of the turning-on transistor $Q_{40}$ are connected between the P gate 23 and the ground potential line 10 and a turning off power source 82 is connected between the base and the ground potential line 10. The anode 21 of the GTO 2 is connected with the positive electrode of the power source 70 for load and the cathode 12 of the GTO 1 is connected with the negative electrode of the power source 70 for load through the ground potential line 10. A return diode 61 is connected between the cathode 22 of the GTO 2 and the ground potential line 10 and a return diode 62 is connected between the anode 11 of the GTO 1 and the positive electrode of the power source 70 for load through a Zener diode 63. The current detection resister 7 controls the pulse signal of the turning-off power source 82, the high voltage side of the current detection resistor 7 being connected with a chopper control circuit not shown in the figure. The turning-on control circuit is omitted in the figure.

In the construction described above the current control of the motor winding L is effected by on-off controlling the GTO 2, keeping the GTO 1 in the on state. At this time the turning-off power source 82 controls the GTO 2 through the turning-off transistor $Q_{40}$, referring to the detection signal obtained by the current detection resistor 7, so that the current flowing through the motor winding L has a predetermined value.

When the GTO 2 is switched-off, current due to a voltage induced by the electro-magnetic energy stored in the motor winding L flows through a low voltage side terminal L-1 of the motor winding L→GTO 1→the current detection resistor 7→the ground potential line 10→the return diode 61→the high voltage side terminal L-2 of the motor winding L. When both the GTOs 1 and 2 are switched-off, the current due to the electromagnetic energy stored in the motor winding L flows through the low voltage side terminal L-1 of the motor winding L→the return diode 62→the Zener diode 63→the power source 70→the ground potential line 10→the return diode 61→the high voltage side terminal of the motor winding L.

Now the behavior of the circuit, when the GTO 1 is in the on state and the GTO 2 passes from the on state to the off state, will be explained. At this time the turning-off power source 82 generates a turning-off pulse signal in order to keep the turning-off transistor $Q_{40}$ in the on state and electric current is taken-out through the P gate 23 of the GTO 2. When the GTO 2 has been turned completely to the off state, the current due to the electro-magnetic energy stored in the motor winding L returns through the GTO 1. Thus, the current detection resister 7 and the return diode 61, the potential of the cathode 22 of the GTO 2 is $-V_{BE}$ with respect to the ground potential line 10, where $V_{BE}$ representes the forward voltage of the return diode 61. This voltage is transmitted to the collector of the turning-off transistor $Q_{40}$ through two current paths, one being the gate resistor 52, the other being the P-N junction between the P gate 23 and the cathode 22 of the GTO 2. While a turning-off pulse signal is applied to the base of the turning-off transistor $Q_{40}$, when the forward voltage $-V_{BE}$ described above is given to the collector of the turning-off transistor $Q_{40}$, this works a as an inverted transistor and current flows from the emitter to the collector. Since this current flows in the direction to flow-in to the P gate 23 of the GTO 2, in this way the GTO 2 tends to be switched-over to the on state. However, when the GTO 2 has been switched-over to the on state, since the potential of the cathode 22 is raised in the positive direction and thus the turning-off transistor $Q_{40}$ begins to take-out again current through the P gate 23, the GTO 2 cannot be switched-over to the on state. As the result, when the turning-off transistor $Q_{40}$ works as an inverted transistor and current flows in the P gate 23 of the GTO 2, since the GTO 2 operates as an NPN transistor, whose collector is the N base layer $N_B$, current flows through the motor winding L by this work of the GTO 2 as an NPN transistor, which produces unnecessary electric power consumption.

When the GTO 1 is switched-over to the off state, since such decrease in the cathode potential is not produced, there is not such inconvenience.

As explained above, in a prior art GTO driving circuit there was a problem that the operation of the turning-off transistor and the GTO is made unstable by influences of the voltage induced by the electromagnetic energy stored in the inductive load, when the GTO is turned-off by switching the turning-off transistor connected with the ground potential line and the P gate of the GTO, to which the inductive load is connected on the cathode side, to the on state, which causes unnecessary current flowing through the load.

SUMMARY OF THE INVENTION

The object of this invention is to provide a GTO turning-off control circuit permitting to turn-off surely a GTO used with an inductive load connected on the cathode side thereof.

In order to achieve this object, a GTO turning-off control circuit according to this invention in which a turning-off transistor circuit for taking-out current is connected with the gate of the GTO, with which an inductive load is connected on the cathode side, is characterized in that the turning-off transistor circuit comprises a first turning-off transistor, whose collector and emitter are connected between the gate of the GTO and the ground potential, a second turning-off transistor, whose collector and emitter are connected between the gate and the cathode of the GTO, and base current control means, which is connected with the first and second turning-off transistors on their base side, and which, when the GTO is turned-off, switches-on the first turning-off transistor in the state where the cathode potential of the GTO is high and the second turning-off transistor in the state where the cathode potential of the GTO is low. Whether the cathode potential of the GTO is high or low is determined, referring to the forward voltage drop between the base and the emitter of the second turning-off transistor.

When the GTO turning-off control circuit is constructed as described above, the object of this invention can be achieved for the reason explained below. That is, when it is tried to turn-off the GTO, which is in the on state, the cathode potential of the GTO is nearly equal to the voltage of the power source for load. Then, when the first turning-off transistor is switched to the on state, current is taken-out through the gate of the GTO owing to this first turning-off transistor and the GTO begins to be switched-over to the off state. As the switch-over of the GTO to the off state advances, the cathode potential is lowered. In a short time the cathode potential is lowered below the ground potential and the first turning-off transistor operates as an inverted transistor. As the result, the GTO tends to operate as an NPN transistor. However, when the cathode potential is lowered to a predetermined value, since the second turning-off transistor is switched-over to the on state, the current taken-out through the gate begins to flow to the cathode, whose potential is lower, and continues it, until the GTO is switched-over completely to the off state.

DESCRIPTION OF THE PREFERRED EMBODIMENTS

Figure 1A:
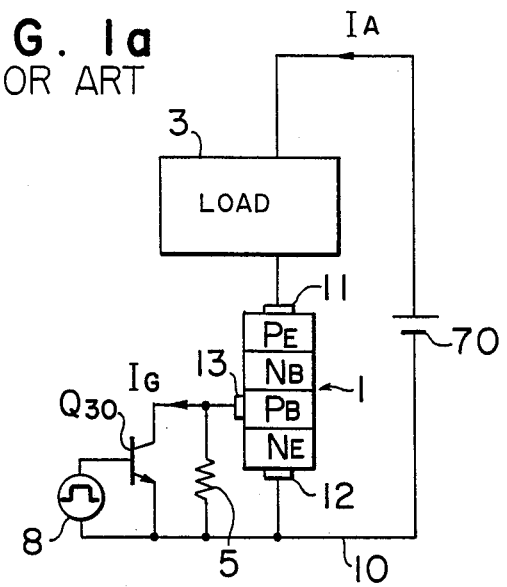
FIGS. 1a and 1b are schematical circuit diagrams of prior art GTO turning-off control circuits.
Figure 1B:
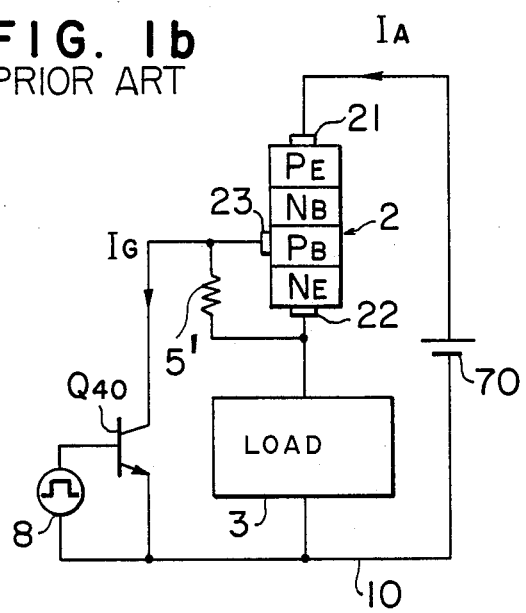

Hereinbelow some preferred embodiments of this invention will be explained more in detail, referring to the drawings.

Figure 2:
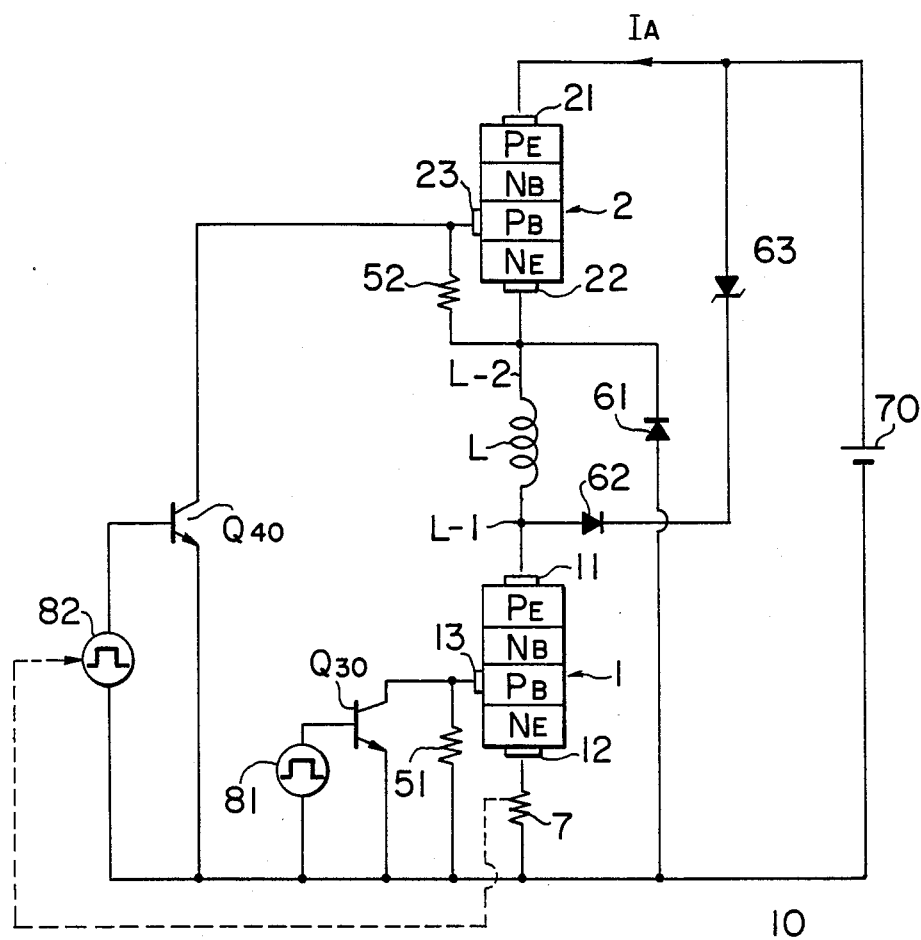
FIG. 2 is a circuit diagram for explaining problems on the turn-off existing when a GTO is used as an inductive load circuit.
Figure 3:
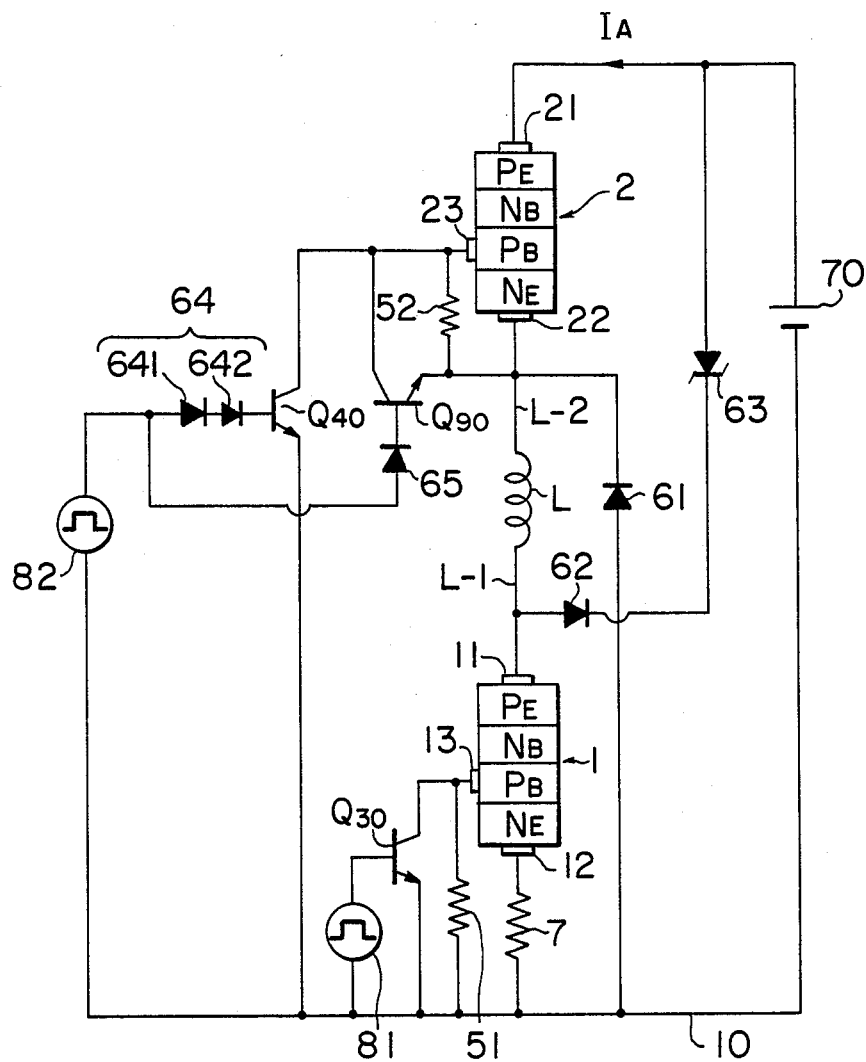
FIG. 3 is a circuit diagram indicating an embodiment of the GTO tutning-off control circuit according to this invention.

FIG. 3 indicates a first embodiment of the GTO turning-off control circuit according to this invention, in which the control circuit turning-off the GTO 1 connected with an inductive load L on the anode side among two GTOs connected with the inductive load L on both sides is same as that indicated in FIG. 2, but the control cirucit turning-off the GTO 2 connected with the inductive load L on the cathode side is elaborated. That is, a diode 64, whose rectifying direction is from the turning-off power source 82 to the base, is connected between the base of the turning-off transistor $Q_{40}$ and the turning-off power source 82, and a turning-off transistor $Q_{90}$ is so disposed that the collector and the emitter thereof are connected between the gate 23 and the cathode 22 of the GTO 2, the base of this turning-off transistor $Q_{90}$ being connected with the diode 64 on the anode side through a diode 65. The rectifying direction of the diode 65 is from the turning-off power source 82 to the base. Further, the diode 64 consists of two diode elements 641 and 642 and the diode 65 consists of one diode element.

Supposing that the GTO 2 is in the on state, it is tried to switch-over it to the off state by applying a pulse thereon from the turning-off power source 82. At this time, the potential of the cathode 22 of the GTO 2 decreases from a potential, which is almost equal to the voltage $V_{CC}$ of the power source 70 for load. The voltage of the turning-off power source 82 connected with the bases of the turning-off transistors $Q_{40}$ and $Q_{90}$ is a logical level and it is at a level, which is remarkably lower than the voltage of the power source 70 for load. For this reason the emitter-base junction of the turning-off transistor $Q_{90}$ is reversely biased and thus the turning-off transistor $Q_{90}$ is in the off state. Since the emitter-base junction of the transistor is a low voltage junction and a high voltage is used for the power source 70 for load, the emitter-base junction of the turning-off transistor $Q_{90}$ is protected by inserting a high voltage diode 65 in the base circuit of the turning-off transistor $Q_{90}$. Since the turning-off transistor $Q_{90}$ is in the off state, as described above, when the GTO 2 begins to be switched-over from the on to the off state, take-out of the current through the P base layer $P_B$ is effected only by the turning-off transistor $Q_{40}$. This is identical to the operation of the turning-off transistor $Q_{40}$ indicated in FIG. 2. However, when the potential $V_K$ of the cathode 22 of the GTO 2 decreases to a value given by the following formula (5);

$$V_K = 2V_{F(64)} + V_{BE(40)} - V_{F(65)} - V_{BE(90)} \qquad (5)$$

where $V_{F(64)}$: forward voltage for each of the diodes 641, 642, $V_{BE(40)}$: forward base-emitter voltage of the turning-off transistor $Q_{40}$, $V_{F(65)}$: forward voltage of the diode 65, and $V_{BE(90)}$: forward base-emitter voltage of the turning-off transistor $Q_{90}$, the turning-off transistor $Q_{40}$ is turned-off and the turning-off transistor $Q_{90}$ is turned-on.

Here, since $V_{F(64)}$, $V_{BE(40)}$, $V_{F(65)}$, $V_{BE(90)}$ and $V_{BE}$ (forward voltage of the return diode 61) are nearly equal to one another and has an order of magnitude of 0.7 [V], the following relation is valid;

$$V_K \approx V_{BE} \approx 0.7 \text{ [V]} \qquad (5a)$$

Now the meaning of the formulas (5) and (5a) will be explained more in detail.

In FIG. 3 a turning-off pulse has two conduction paths, the first path being the turning-off power source 82→the diode 64→the base of the turning-off transistor $Q_{40}$→the emitter of the turning-off transistor $Q_{40}$→the ground potential, the second path being the turning-off power source 82→the diode 65→the base of the turning-off transistor $Q_{90}$→the emitter of the turning-off transistor $Q_{90}$→a part of the GTO 2, to which the cathode voltage $V_K$ is applied→the ground potential. If the cathode potential $V_K$ of the GTO 2 is greater than the value represented by the formula (5), the turning-off transistor $Q_{90}$ is in the off state and the turning-off pulse flows through the first path. On the contrary, if the cathode potential $V_K$ of the GTO 2 is smaller than the value represented by the formula (5), the turning-off transistor $Q_{90}$ is in the on state and the turning-off pulse flows through the second path. That is, the selection on switching-on or -off of the turning off transistors $Q_{40}$ and $Q_{90}$ is determined, depending on which is greater, the forward voltage of the diode 64 and the sum of the forward voltage of the diode 65 and the cathode potential $V_K$ of the GTO 2.

In the embodiment illustrated in FIG. 3, since one diode element 65 is disposed for the protection of the turning-off transistor $Q_{90}$, two diode elements 641 and 642 are disposed for the turning-off transistor $Q_{40}$ in order to effect the switching-over from the turning-off transistor $Q_{40}$ to the turning-off transistor $Q_{90}$.

As the result, as indicated in TABLE 1, the turning-off transistors $Q_{40}$ and $Q_{90}$ are switched-over alternately, depending on the cathode potential $V_K$ of the GTO 2.

TABLE 1

| Value of $V_K$ | $Q_{40}$ | $Q_{90}$ | Turn-off principle of GTO 2 |
|---|---|---|---|
| $V_K > V_{BE}$ | Active | Blocked | Take-out current through P gate by $Q_{40}$ |
| $V_K < V_{BE}$ | Blocked | Active→saturated | Take-out current through P gate by $Q_{90}$ |

Variations in the cathode potential $V_K$ of the GTO 2 are caused by the passage from the on state to the off state of the GTO 2 and in this way the switching-over of these turning-off transistors $Q_{40}$ and $Q_{90}$ is effected perfectly automatically.

Now it is supposed that the GTO 2 is completely turned-off and that the current stored in the inductive load L flows through the return diode 61 so that $V_K$ is negative. Also in this case the conductive path of the first path is invalid and the turning-off transistor $Q_{40}$ doesn't operate as an inverted transistor. That is, the emitter of the turning-off transistor $Q_{90}$ is connected with the cathode 22 of the GTO 2 and the collector thereof is connected with the P gate 23 of the GTO 2. For this reason, even if the cathode potential $V_K$ of the GTO 2 is negative, since the collector potential of the turning-off transistor $Q_{90}$ is higher than the emitter potential of the turning-off transistor $Q_{90}$, the turning-off transistor $Q_{90}$ doesn't operate as an inverted transistor. In addition, since the conductive path of the second path is valid and take-out of current through the P gate 23 by the turning-off transistor $Q_{90}$ is effected, the GTO 2 cannot be turned-on.

As explained above, according to this invention, the GTO 2 used in the floating state is surely turned-off by the turning-off transistors $Q_{40}$ and $Q_{90}$. Since the GTO can break current higher than the transistor as a switch, it is possible to make high current flow through the inductive load, and further since the turning-off transistors $Q_{40}$ and $Q_{90}$ may be small, they are convenient to be integrated on a chip.

Figure 4:
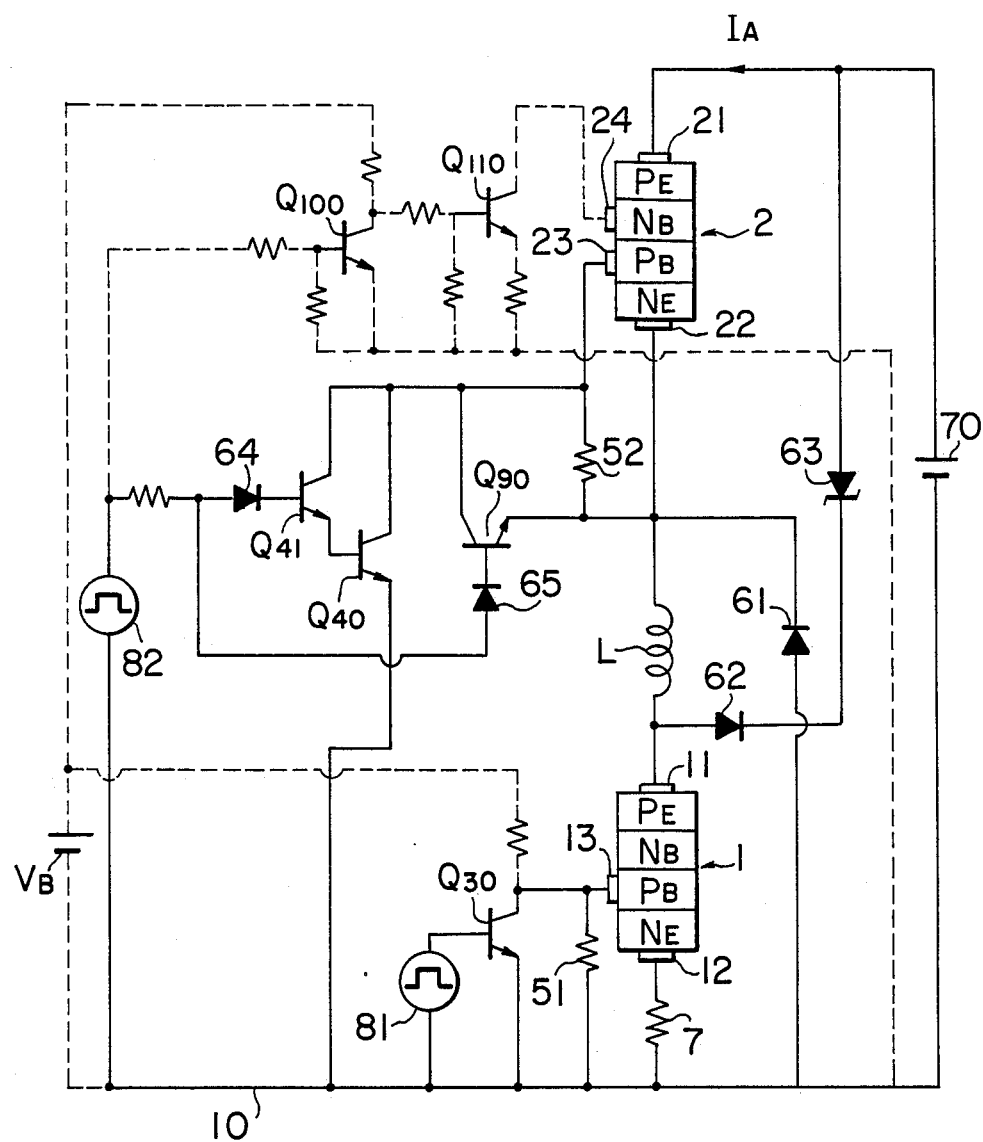
FIG. 4 is a circuit diagram indicating another embodiment of the GTO turning-off control circuit according to this invention.

FIG. 4 illustrates a second embodiment of the GTO turning-off control circuit according to this invention.

In this embodiment a transistor $Q_{41}$ is added before the turning-off transistor $Q_{40}$ so as to form a Darlington circuit in order to increase the capacity to take-out current through the P gate of the turning-off transistor $Q_{40}$ in FIG. 3 so that the turn-off is possible, even if the anode current $I_A$ of the GTO 2, i.e., the current flowing through the inductive load L is great. The base-emitter junction of this Darlington transistor $Q_{41}$ corresponds to one diode element of the diode 64 indicated in FIG. 3. For this reason, in FIG. 4, the diode 64 consists of one diode element. In this embodiment the turn-on control circuit is indicated by broken lines. A transistor $Q_{100}$ acts as an inverter for inverting the signal coming from a control power source 82 and a transistor $Q_{110}$ plays the role to take-out current through the N gate 24 of the GTO 2 so as to turn-on the GTO 2. On the other hand, the GTO 1 is controlled by a power source 81 and a transistor $Q_{30}$. That is, when the signal from the power source 81 is at a low level, the transistor $Q_{30}$ is turned-off and current is supplied to the P gate of the GTO 1 from a logical power source $V_B$ so that the GTO 1 is driven to the on state. When the signal from the power source 81 is at a high level, the transistor $Q_{30}$ is turned-on and acts just as explained referring to FIG. 1a, so that the GTO 1 is driven to the off state. Here, usually a voltage of 5 V is used for the logical power source $V_B$.

Figure 5:
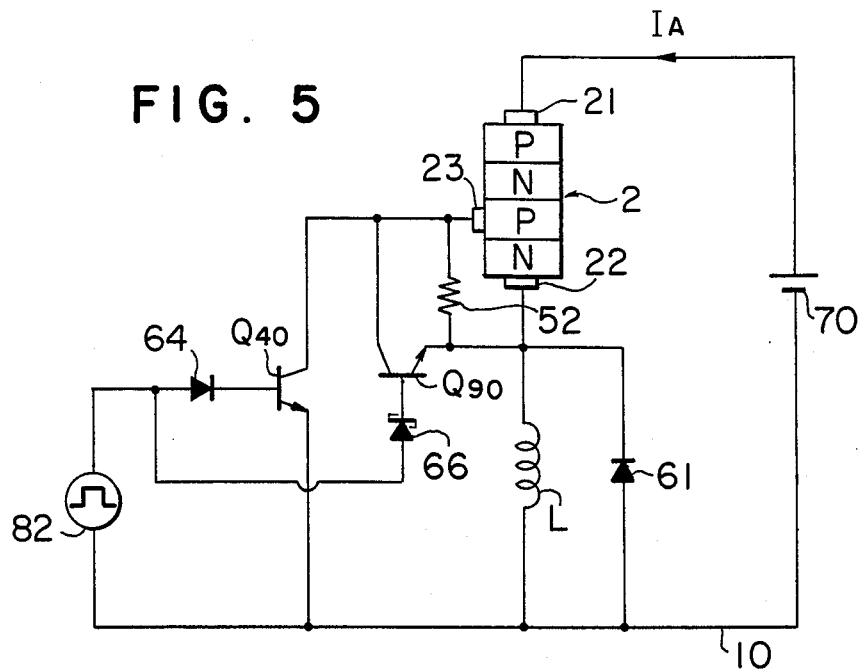
FIGS. 5 and 6 are circuit diagrams indicating still other embodiments of the GTO turning off control circuit according to this invention.

FIG. 5 illustrates a third embodiment of the GTO turn-off control circuit according to this invention, where only the GTO 2 side is indicated in order to avoid duplicated explanation. What differs from the embodiment indicated in FIG. 3 consists in that a Schottky barrier diode 66 is used in lieu of the diode 65 and that the diode 64 is constructed by only one diode element. According to this construction, since the forward voltage drop of a Schottky barrier diode is smaller than that of a usual PN junction diode, an operation similar to that explained by referring to FIG. 3 can be expected and it is possible to reduce the number of parts with respect to that necessary for the circuit indicated in FIG. 3.

Figure 6:
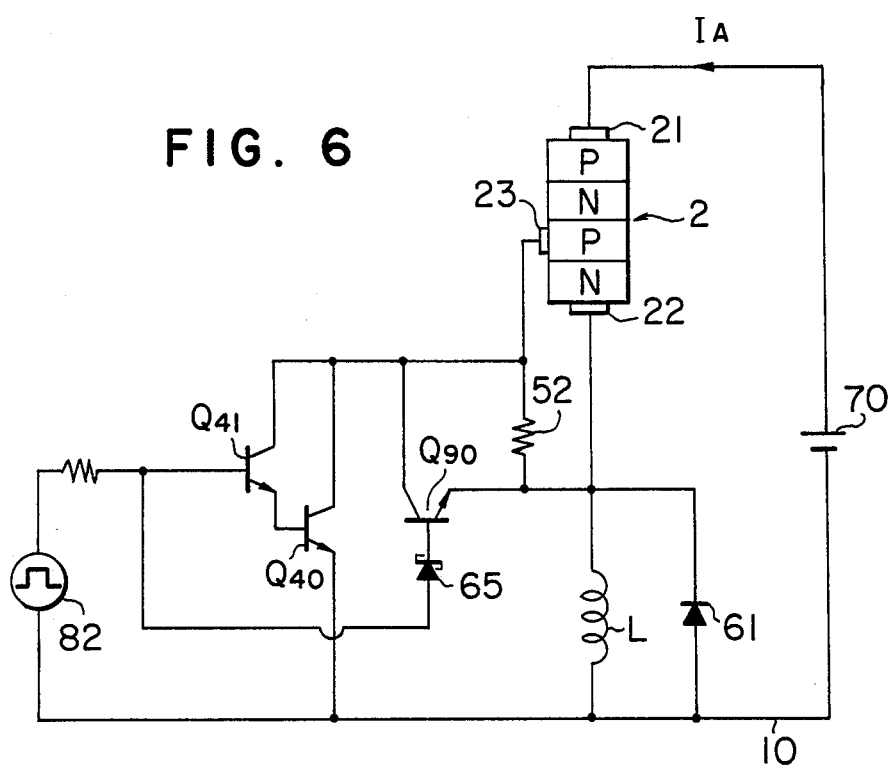

FIG. 6 illustrates a fourth embodiment of the GTO turn-off control circuit according to this invention. What differs from the embodiment indicated in FIG. 4 consists in that a transistor $Q_{41}$ is disposed before the transistor $Q_{40}$ so as to form a Darlington circuit and that the diode 64 is omitted. The operation of this embodiment is nearly equal to that of the embodiment indicated in FIG. 4.

As explained above, according to this invention, it is possible to turn-off surely a GTO, which is used in the state where an inductive load is connected therewith on the cathode side.

We claim:

1. A turn-off control circuit for a gate turn-off thyristor, which is used in a state where one end of an inductive load is connected therewith on a cathode side of said gate turn-off thyristor, comprising:
   (a) a first turning-off transistor, whose collector and emitter are connected between a gate of said gate turn-off thyristor and the other end of said inductive load;
   (b) a second turning-off transistor, whose collector and emitter are connected between the gate and the cathode of said gate turn-off thyristor; and
   (c) base current controlling means connected between bases of said first and second turning-off transistors and a turning-off power source, for selectively turning-on said first and second turning-off transistors, when said gate turn-off thyristor should be turned-off.

2. A turn-off control circuit for a gate turn-off thyristor according to claim 1, wherein said base current controlling means is constructed so as to turn-on said first turning-off transistor, when a cathode potential of said gate turn-off thyristor is higher than a forward voltage drop between the base and the emitter of said second turning-off transistor, and to turn-on said second turning-off transistor, when the former is lower than the latter.

3. A turn-off control circuit for a gate turn-off thyristor according to claim 1, wherein said base current controlling means comprises a first diode connected between the base of said first turning-off transistor and said turning-off power source and a second diode connected between base of said second turning-off transistor and said turning-off power source and having a forward voltage drop, which is lower than that of said first diode.

4. A turn-off control circuit for a gate turn-off thyristor according to claim 3, wherein said first diode comprises two diode elements and said second diode consists of only one diode element.

5. A turn-off control circuit for a gate turn-off thyristor according to claim 3, wherein said first diode is a PN junction diode and said second diode is a Schottky barrier diode.

6. A turn-off control circuit for a gate turn-off thyristor according to claim 1, wherein said base current controlling means comprises an additional transistor, whose collector and emitter are connected between the collector and the base of said first turning-off transistor; a first diode connected between a base of said additional transistor and said turning-off power source; and a second diode connected between the base of said second turning-off transistor and said turning-off power source.

7. A turn-off control circuit for a gate turn-off thyristor according to claim 1, wherein said base current controlling means comprises an additional transistor, whose collector and emitter are connected between the collector and the base of said first turning-off transistor and whose base is connected with said turning-off power source; and a Schottky barrier diode, which is connected between the base of said second turning-off transistor and said turning-off power source.

* * * * *